(12) United States Patent
Koo et al.

(10) Patent No.: US 7,973,315 B2
(45) Date of Patent: Jul. 5, 2011

(54) THIN FILM TRANSISTOR, FLAT PANEL DISPLAY DEVICE THEREWITH, AND METHOD OF MANUFACTURING THE THIN FILM TRANSISTOR

(75) Inventors: Jae-Bon Koo, Suwon-si (KR); Hye-Dong Kim, Suwon-si (KR); Min-Chul Suh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 179 days.

(21) Appl. No.: 11/167,157

(22) Filed: Jun. 28, 2005

(65) Prior Publication Data

US 2006/0011917 A1    Jan. 19, 2006

(30) Foreign Application Priority Data

Jun. 29, 2004    (KR) .................. 10-2004-0049714

(51) Int. Cl.
*H01L 29/786*    (2006.01)
(52) U.S. Cl. ....... 257/72; 257/59; 257/66; 257/E21.411; 257/E29.273
(58) Field of Classification Search .............. 257/59, 257/66, 72, E29.151, E21.411, E29.273
See application file for complete search history.

(56) References Cited

U.S. PATENT DOCUMENTS

| 5,763,904 | A * | 6/1998 | Nakajima et al. ............. 257/66 |
| 6,355,956 | B1 * | 3/2002 | Kim .............................. 257/347 |
| 6,492,026 | B1 * | 12/2002 | Graff et al. ................. 428/411.1 |
| 2002/0025614 | A1 * | 2/2002 | Jang et al. ..................... 438/158 |
| 2002/0113236 | A1 * | 8/2002 | Park et al. ....................... 257/61 |
| 2003/0180991 | A1 * | 9/2003 | Seo et al. ...................... 438/151 |
| 2004/0079940 | A1 * | 4/2004 | Redecker et al. ............... 257/40 |
| 2004/0140468 | A1 * | 7/2004 | Liao et al. ....................... 257/52 |

FOREIGN PATENT DOCUMENTS

| KR | 1020000003108 A | 1/2000 |
| KR | 1020040054441 A | 6/2004 |

\* cited by examiner

*Primary Examiner* — Kenneth A Parker
*Assistant Examiner* — Jay C Kim
(74) *Attorney, Agent, or Firm* — H.C. Park & Associates, PLC

(57) ABSTRACT

A thin film transistor that does not deform or exfoliate due to thermal or mechanical stress, a flat panel display having the same, and a method manufacturing the same, the thin film transistor including a substrate, a patterned buffer layer disposed on the substrate, a patterned active layer disposed on the buffer layer, a gate electrode insulated from the active layer, and a source electrode and a drain electrode that contact the active layer and are insulated from the gate electrode.

8 Claims, 15 Drawing Sheets

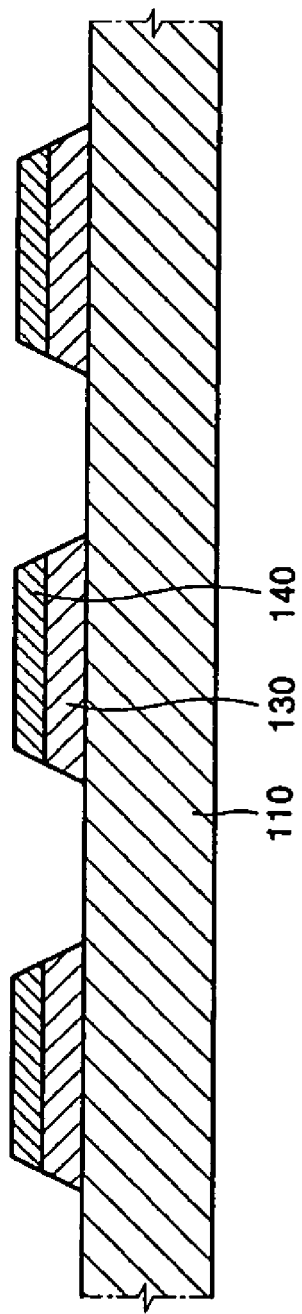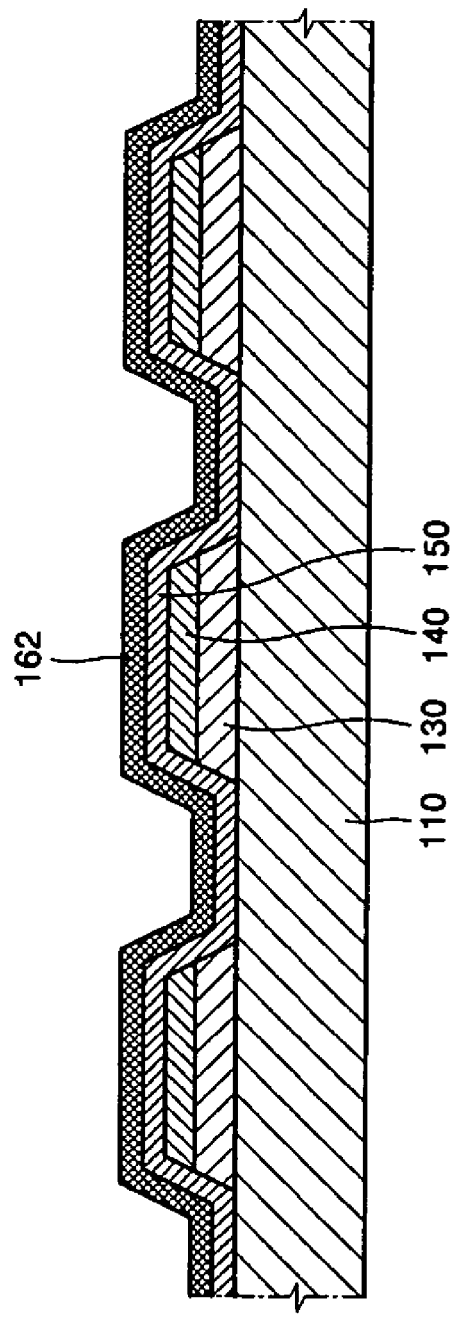

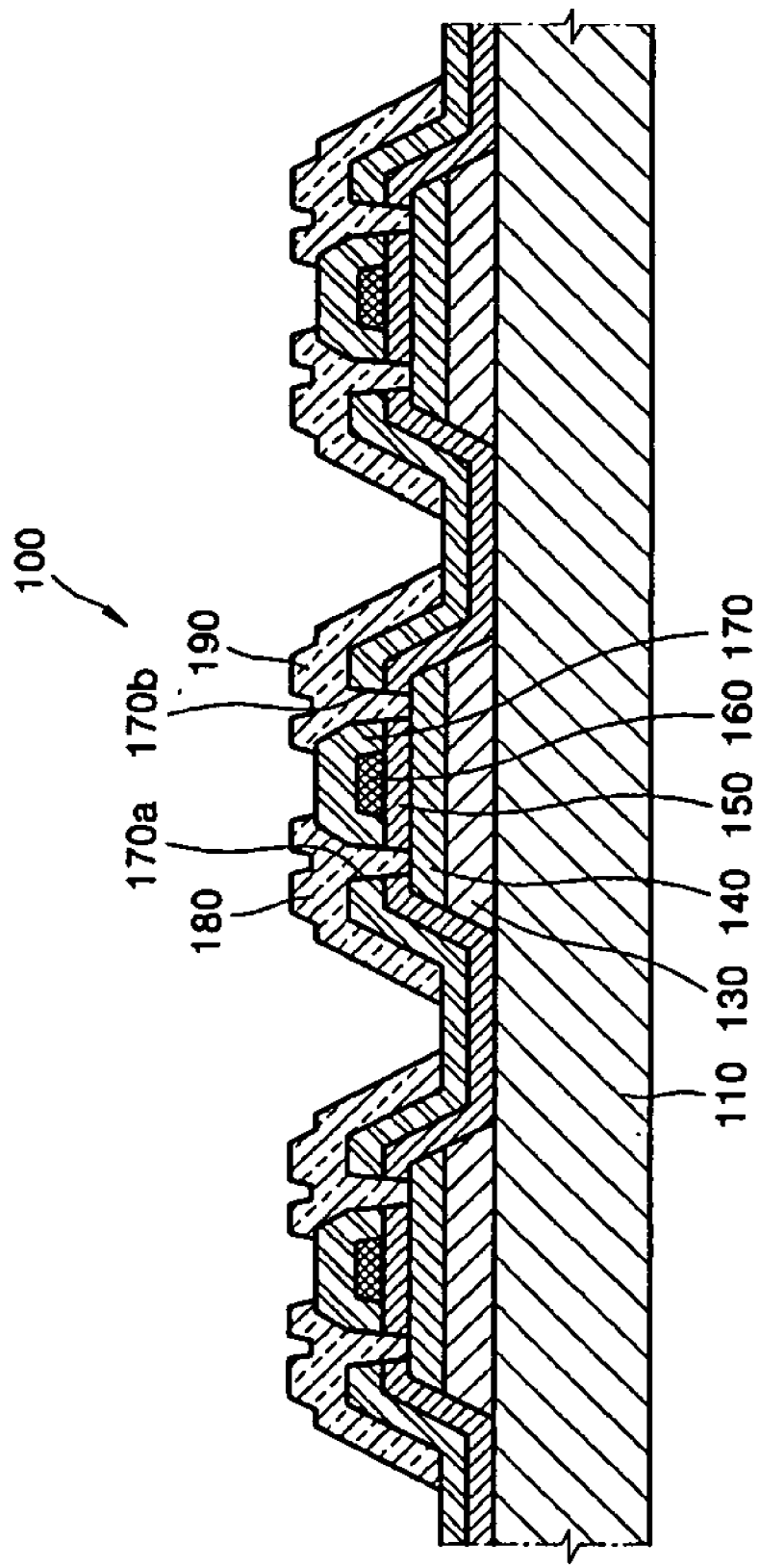

THIN FILM TRANSISTOR, FLAT PANEL DISPLAY DEVICE THEREWITH, AND METHOD OF MANUFACTURING THE THIN FILM TRANSISTOR

BACKGROUND OF THE INVENTION

This application claims the priority of Korean Patent Application No. 10-2004-0049714, filed on Jun. 29, 2004, which is hereby incorporated by reference for all purposes as if fully set forth herein.

FIELD OF THE INVENTION

The present invention relates to a thin film transistor (TFT), a flat panel display having the TFT, and a method of manufacturing the TFT, and more particularly, relates to a TFT that does not deform or exfoliate due to a thermal or mechanical stress, a flat panel display having the TFT, and a method of manufacturing the TFT.

DESCRIPTION OF THE RELATED ART

The application of TFTs, liquid crystal display (LCD) and electroluminescence display (ELD) using the TFTs have been expanded to display devices for mobile equipment, such as flat panel display devices, digital cameras, video cameras, personal digital assistants (PDAs), or mobile phones.

The displays, in particular, the mobile displays, should be thin, light, flexible, and resistant to breakdown. When manufacturing a flexible display, it is important to prevent deformation or exfoliation thereof caused by thermal or mechanical stress.

FIG. 1 is a cross-sectional view illustrating a conventional TFT 1, and FIG. 2 is a cross-sectional view illustrating a conventional TFT 2. Referring to FIGS. 1 and 2, a buffer layer 30 and a first insulating film 50 are formed on a substrate 10.

When the substrate 10 is twisted or a thermal or mechanical stress is applied thereto, the buffer layer 30 and the first insulating film 50 are also twisted or subjected to the thermal or mechanical stress. Accordingly, there is a problem in that the buffer layer 30 or the first insulating film 50 deform or exfoliate.

SUMMARY OF THE INVENTION

The present invention provides a TFT that does not deform or exfoliate due to a thermal or mechanical stress, a flat panel display having the TFT, and a method of manufacturing the TFT.

The present invention discloses a thin film transistor including a substrate, a patterned buffer layer provided on the substrate, a patterned active layer provided on the patterned buffer layer, a gate electrode insulated from the patterned active layer, and a source electrode and a drain electrode that contact the patterned active layer and are insulated from the gate electrode.

The present invention also discloses a method of manufacturing a thin film transistor including forming a patterned buffer layer on a substrate, forming a patterned active layer on the patterned buffer layer, forming a first insulating film covering the active layer, forming a first metal layer on the first insulating film, forming a gate electrode by patterning the first metal layer, forming a second insulating film covering the gate electrode, forming a first contact hole and a second contact hole in the first insulating film and the second insulating film to expose the active layer, forming a second metal layer on the second insulating film, and forming a source electrode and a drain electrode respectively connected with the active layer through the first contact hole and the second contact hole by patterning the second metal layer.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

FIGS. 12, 13, 14, 15, and 16 are cross-sectional views illustrating a method of manufacturing a TFT according to an embodiment of the invention.

DETAILED DESCRIPTION OF THE ILLUSTRATED EMBODIMENTS

The present invention will now be described more fully with reference to the accompanying drawings in which illustrative exemplary embodiments of the invention are shown.

Figure 3:
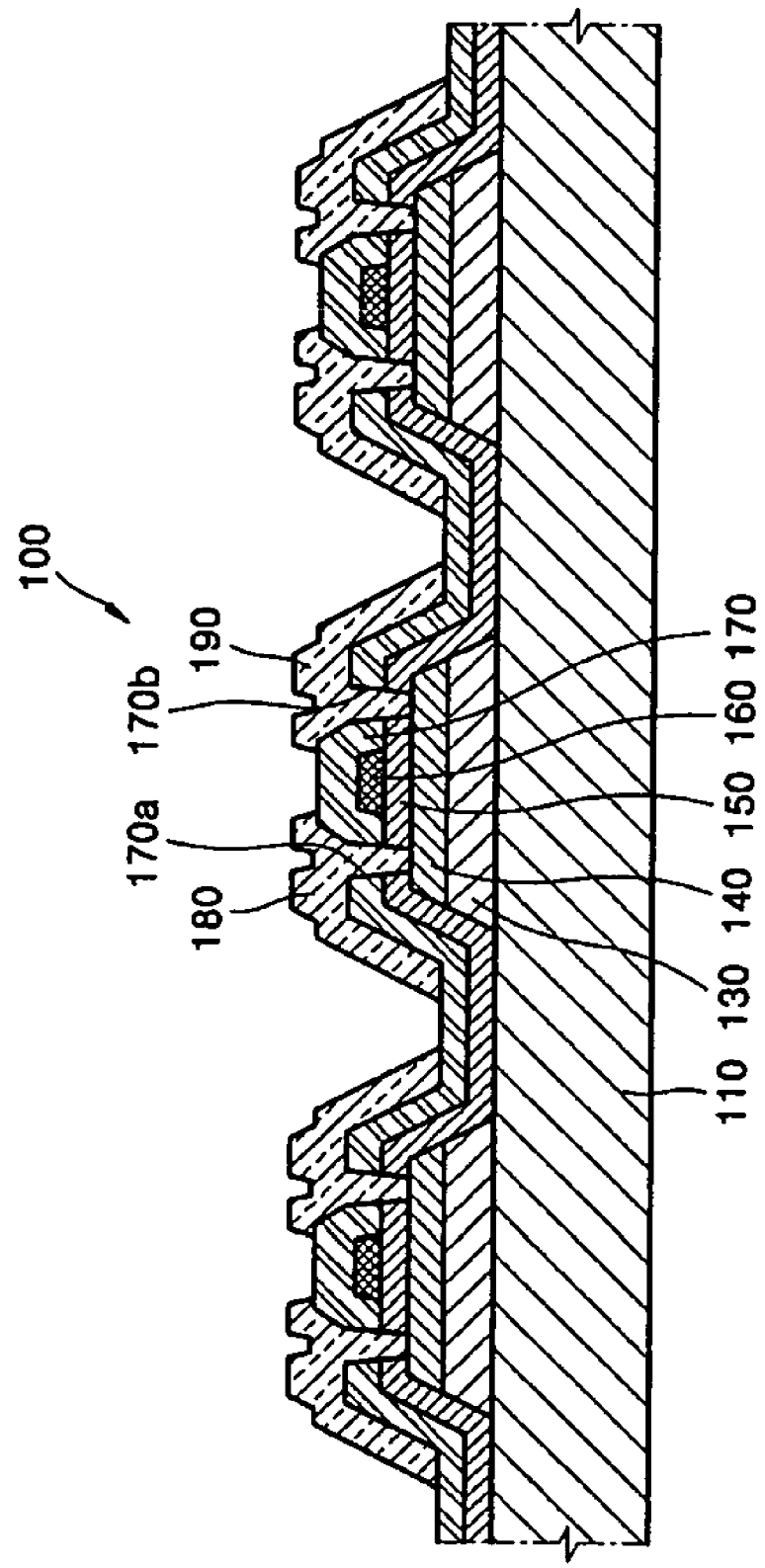
FIG. 3 is a cross-sectional view illustrating a TFT according to an embodiment of the invention.

FIG. 3 is a cross-sectional view illustrating a TFT 100 according to an embodiment of the invention. Referring to FIG. 3, a patterned buffer layer 130 that may be formed of silicon oxide or silicon nitride, a patterned active layer 140 that may be formed to directly correspond with the patterned buffer layer 130 on the buffer layer 130, and a gate electrode 160 that may be formed of MoW and insulated from the active layer 140 are included on a substrate 110. The substrate 110 further includes a source electrode 180 and a drain electrode 190, which are insulated from the gate electrode 160 and respectively make contact with the active layer 140 through a first contact hole 170a and a second contact hole 170b, are included on the substrate 110. A first insulating film 150 may insulate the active layer 140 from the gate electrode 160, and a second insulating film 170 may insulate the gate electrode 160 from the source electrode 180 and the drain electrode 190.

Figure 1:
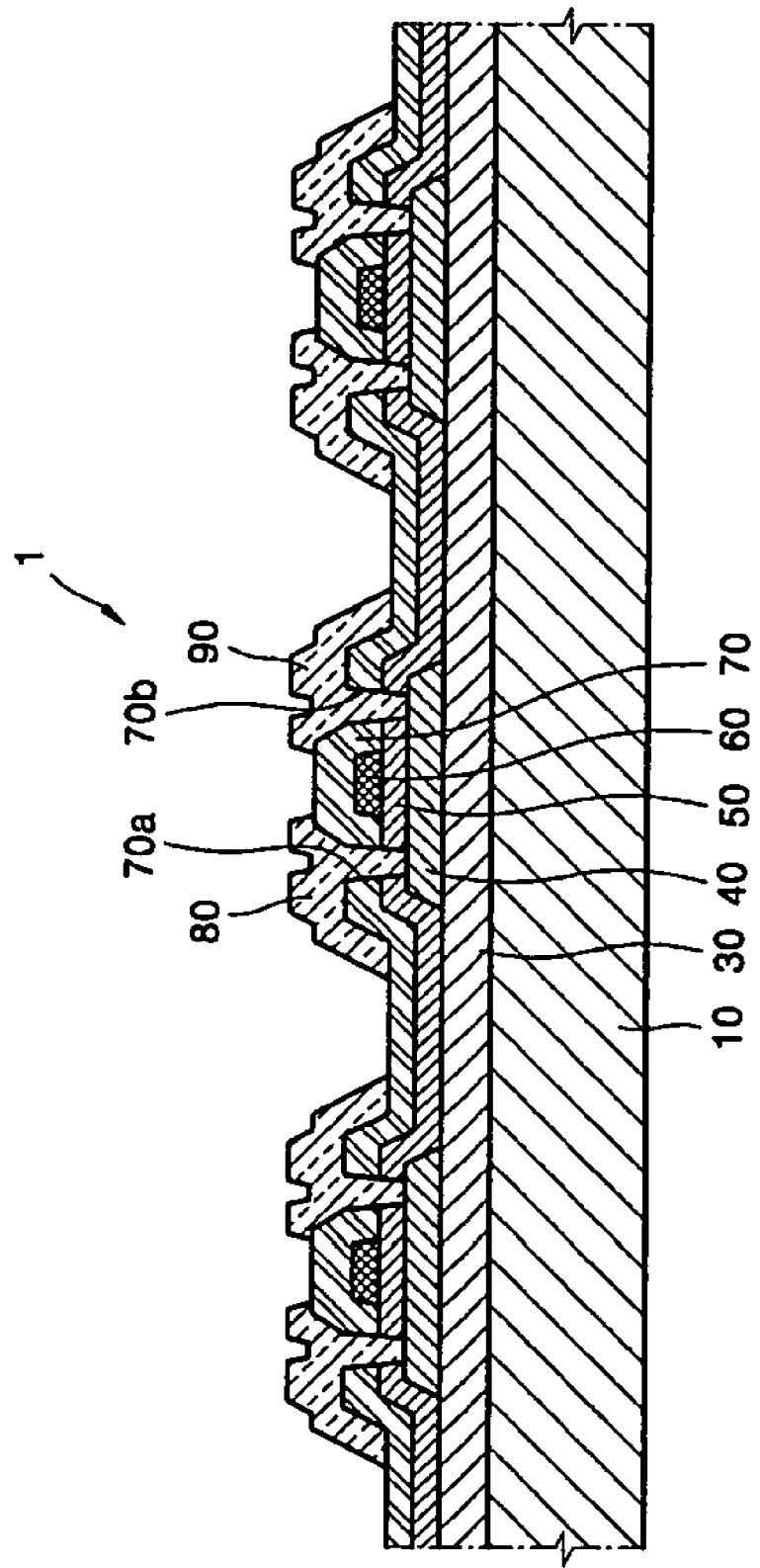
FIG. 1 is a cross-sectional view of a conventional TFT.

Unlike the structure shown in FIG. 1, the buffer layer 130 of the structure discussed above and shown in FIG. 3 is patterned in substantially the same pattern as the active layer 140.

Thus, a mechanical stress applied to the buffer layer 130 when the substrate 110 is twisted may be reduced by patterning the buffer layer 130 in substantially the same pattern as the active layer 140, thereby preventing the deformation or exfoliation of the TFT.

Particularly, when an adhesion force between the buffer layer 130 and the substrate 110 is not strong, the buffer layer 130 may exfoliate or become removed from the substrate 110 when a mechanical stress or a torque is applied to the substrate 110. As described above, the exfoliation of the TFT can be prevented by patterning the buffer layer 130 in substantially the same pattern as the active layer 140.

The active layer 140 may be a polycrystalline silicon layer. When the active layer is a polycrystalline silicon layer, a process for forming the polycrystalline silicon layer from an amorphous silicon layer is needed. The TFT may deform or exfoliate due to heat generated when the polycrystalline silicon layer is formed from the amorphous silicon layer or due to heat generated in a subsequent process. However, the deformation or exfoliation of the TFT due to heat may be prevented by patterning the buffer layer 130 in substantially the same pattern as the active layer 140. Also, the TFT may be deformed or exfoliated due to a difference in a thermal expansion coefficient between the buffer layer 130 and the substrate 110 when heat is applied to the TFT in a subsequent process regardless of the flexibility of the substrate 110. Likewise, in this case, the deformation or exfoliation of the TFT may be prevented by forming the buffer layer 130 in the same pattern as the active layer 140 as depicted in FIG. 3.

The substrate 110 in the first embodiment may be a flexible substrate, such as a metal foil or a plastic material; however, the present invention is not limited thereto.

Figure 4:
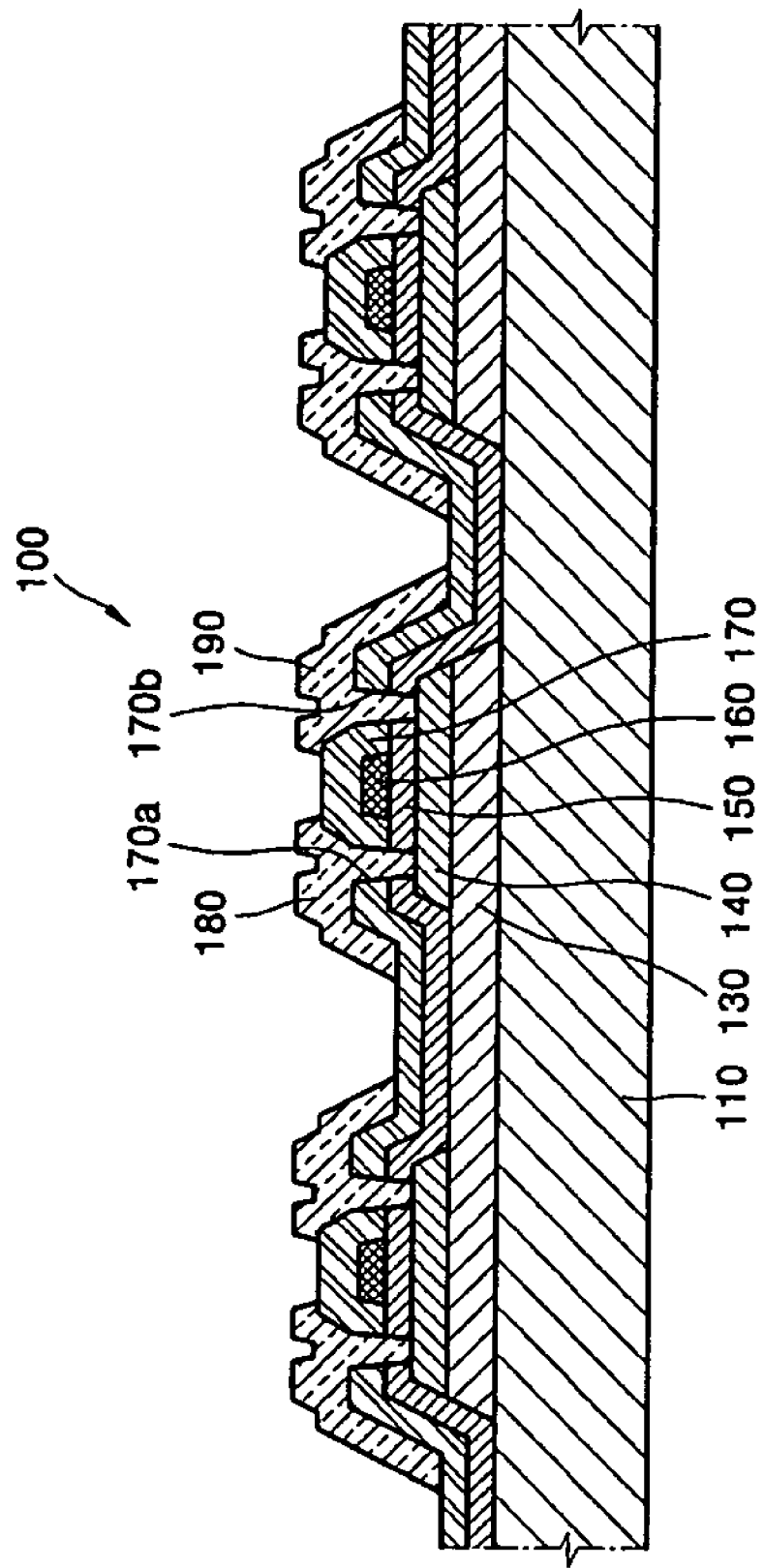
FIG. 4 is a cross-sectional view illustrating a TFT according to embodiment of the invention.

According to an embodiment of the invention shown in FIG. 4, at least two regions of patterned active layers 140 may be provided on one region of patterned buffer 130. Thus, the TFT structure described above may be applied to any TFT in which the buffer layer 130 is patterned. Also, an end part of the patterned buffer layer 130 may not necessarily be identical as an end part of the patterned active layer 140. The same is true in the subsequent embodiments to be described.

Figure 5:
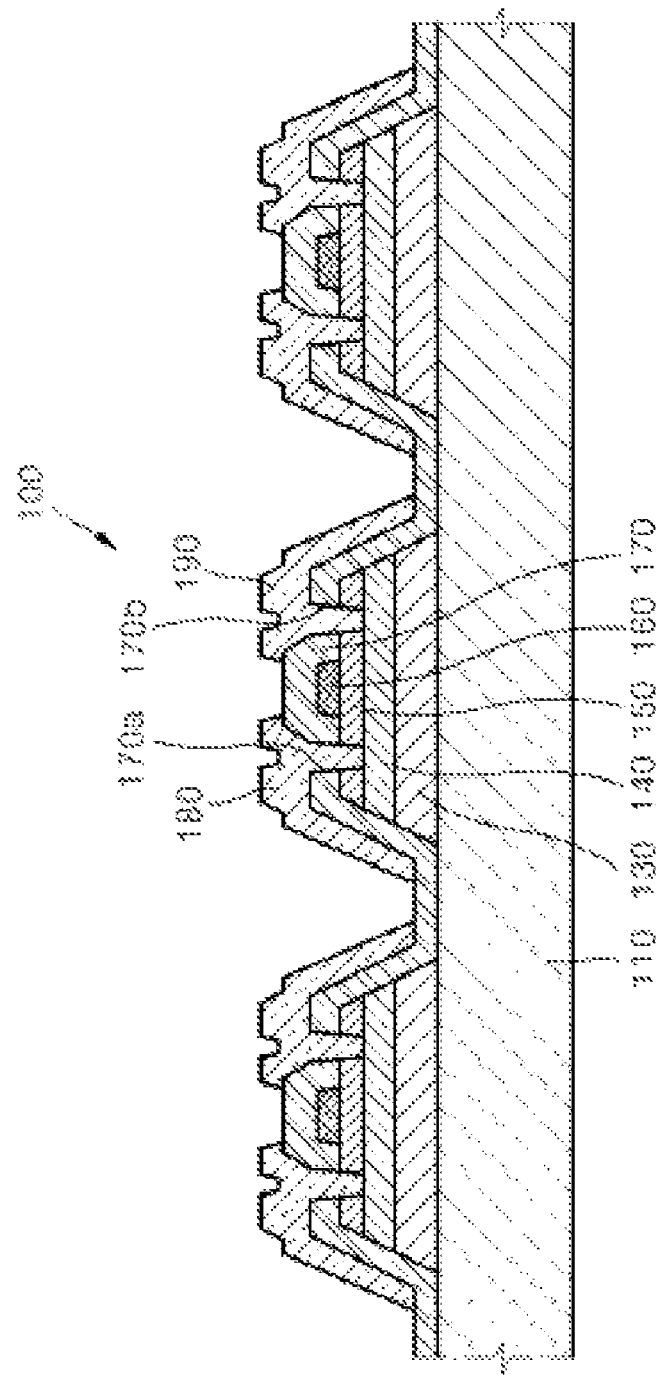
FIG. 5 is a cross-sectional view illustrating a TFT according to an embodiment of the invention.

FIG. 5 is a cross-sectional view illustrating a TFT according to another embodiment of the invention. Referring to FIG. 5, a patterned buffer layer 130 formed of silicon oxide or silicon nitride, a patterned active layer 140 in direct correspondence with the patterned buffer layer 130, and a gate electrode 160 that may be formed of MoW and insulated from the active layer 140, are included on a substrate 110. The substrate 110 further includes a source electrode 180 and a drain electrode 190, which are insulated from the gate electrode 160 and respectively make contact with the active layer 140.

Unlike the structure described above and shown in FIG. 1, the structure described above and shown in FIG. 5 includes the buffer layer 130 patterned in substantially the same pattern as the active layer 140.

Further, the TFT of the structure discussed above and shown in FIG. 5 is different is from the TFT discussed above and shown in FIG. 3 because in FIG. 5 the first insulating film 150 is patterned in direct correspondence with the active layer 140.

Thus, as depicted in FIG. 5, the deformation or the exfoliation of the TFT may be prevented by reducing mechanical stress applied to the buffer layer 130 and the first insulating film 150, caused by, for example, twisting the substrate 110 by arranging the patterned first insulating film 150, which insulates the active layer 140 from the gate electrode 160, in a direct correspondence with the patterned active layer 140 and simultaneously patterning the buffer layer 130 in substantially the same pattern as the active layer 140.

The active layer 140 may be a polycrystalline silicon layer. When the active layer 140 is a polycrystalline silicon layer, a process for forming the polycrystalline silicon layer from an amorphous silicon layer is needed. The TFT may deform or exfoliate due to heat generated from the process for forming the polycrystalline silicon layer from an amorphous silicon layer or due to heat generated in a subsequent process. However, the deformation or exfoliation of the TFT due to heat may be prevented by patterning the buffer layer 130 in substantially the same pattern as the active layer 140. The TFT may deform or exfoliate due to a difference in thermal expansion coefficient between the buffer layer 130 and the substrate 110 when heat is applied to the TFT in a subsequent process regardless of the flexibility of the substrate 110. In this case, the deformation or exfoliation of the TFT may also be prevented by forming the buffer layer 130 in substantially the same pattern as the active layer 140, as shown in FIG. 5.

As described above and shown in FIG. 3 and FIG. 5, second insulating films 170 that insulate the gate electrodes 160 from the source electrodes 180 and the drain electrodes 190 may be further included in the TFTs according to the embodiments described above and the embodiments described below.

Further, the TFT described above and shown in FIG. 5 is patterned such that the buffer layer 130, the active layer 140, and the first insulating film 150 are in direct correspondence; however, the invention is not limited thereto. For example, more than two regions of the active layers may be provided on one region of patterned buffer layer 130, and the first insulating film 150 provided on the active layer 140 may also be provided on two or more patterned regions.

Figure 6:
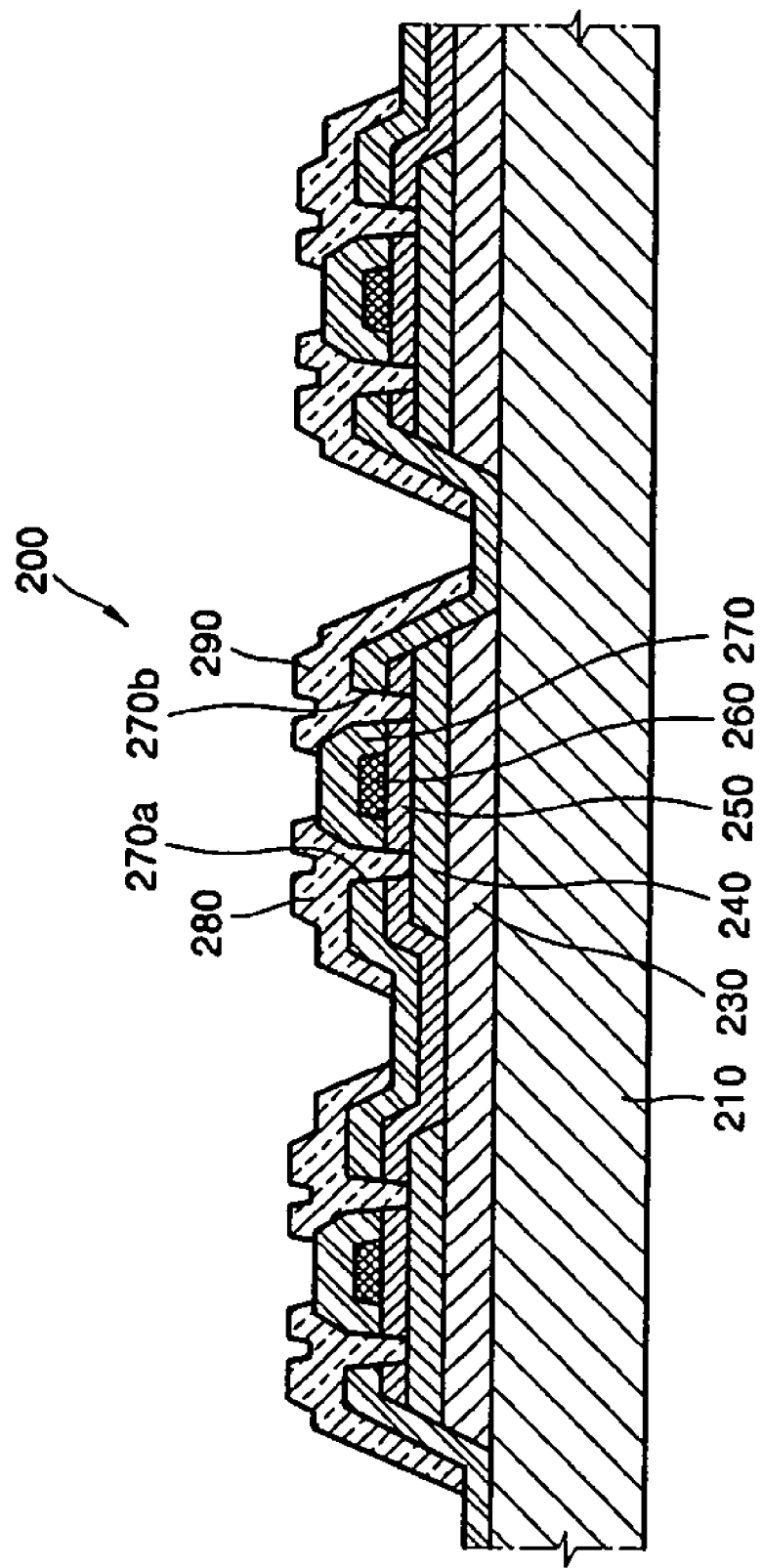
FIG. 6 is a cross-sectional view illustrating a TFT according to an embodiment of the invention.

For example, referring to FIG. 6, the patterned first insulating film 250 may directly correspond with the patterned buffer layer 230, but the active layer 240 may be patterned differently. In other words, two regions of the patterned active layer 240 may be provided on one region of patterned buffer 230 and one region of the patterned first insulating film 250 may be provided on one of the patterned active layer 240. Also, as shown in FIG. 6, which is a cross-sectional view illustrating a TFT 200 according to another embodiment of the present invention, the patterned buffer layer 230, the patterned active layer 240, and a gate electrode 260 are formed on a substrate 210. A source electrode 280 and a drain electrode 290 are respectively insulated from the gate electrode 260 and contact the active layer 240 through a first contact hole 270$a$ and a second contact hole 270$b$. A second insulating film 270 may insulate the gate electrode 260 from the source electrode 280 and the drain electrode 290.

Figure 7:
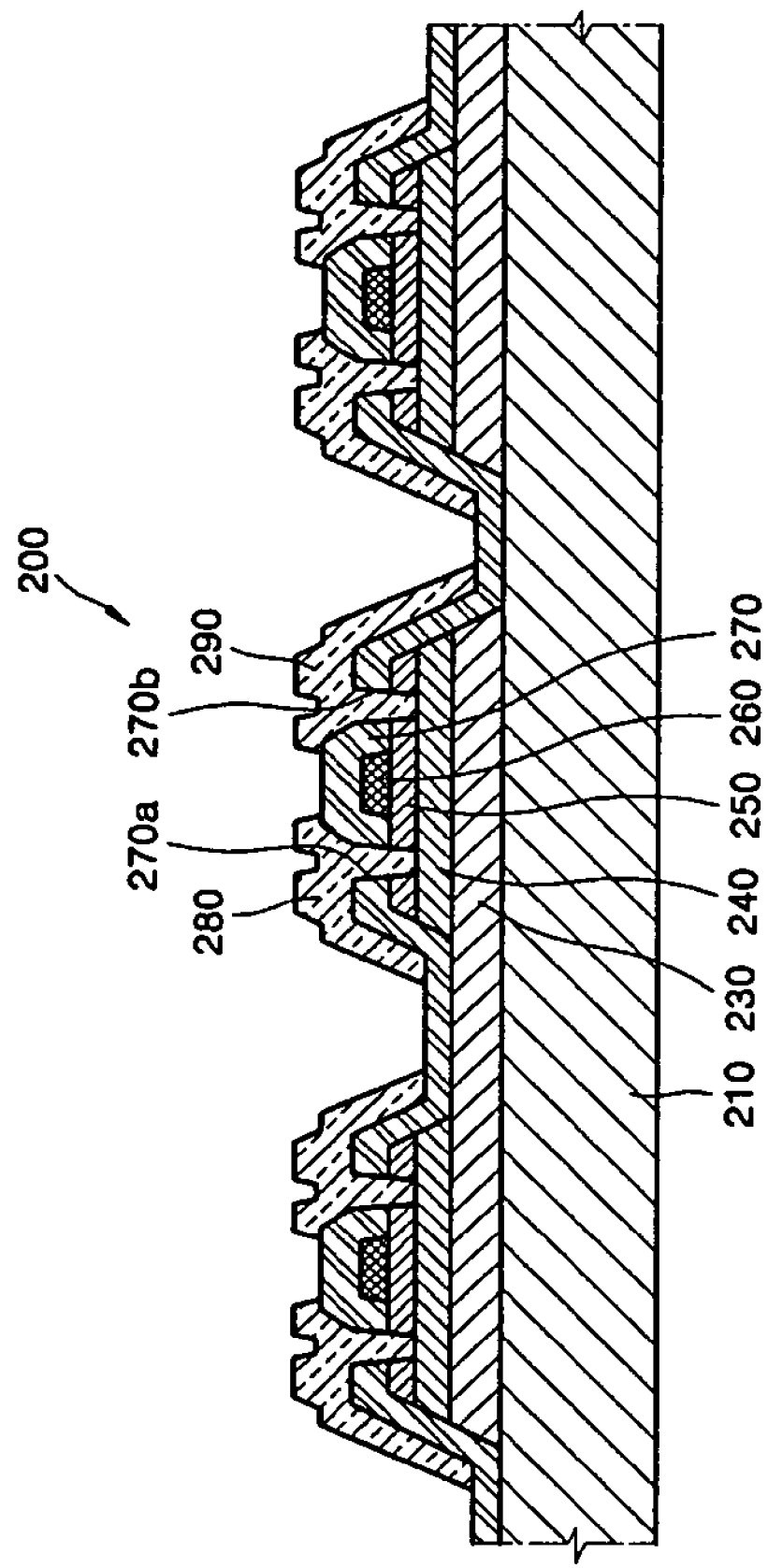
FIG. 7 is a cross-sectional view illustrating a TFT according to an embodiment of the invention.

Also, referring to FIG. 7, the patterned first insulating film 250 may directly correspond with the patterned active layer 240, and the buffer layer 230 may be patterned differently. In other words, two regions of the patterned active layer 240 may be provided on one region of patterned buffer 230 and the patterned first insulating film 250 may directly correspond with the patterned active layer 240 and may be provided on the patterned active layer 240. The present invention is not limited to the above described embodiments shown in FIG. 6 and FIG. 7 and may be applied to any TFT where the buffer layer 230 and the first insulating film 250 are patterned.

Figure 8:
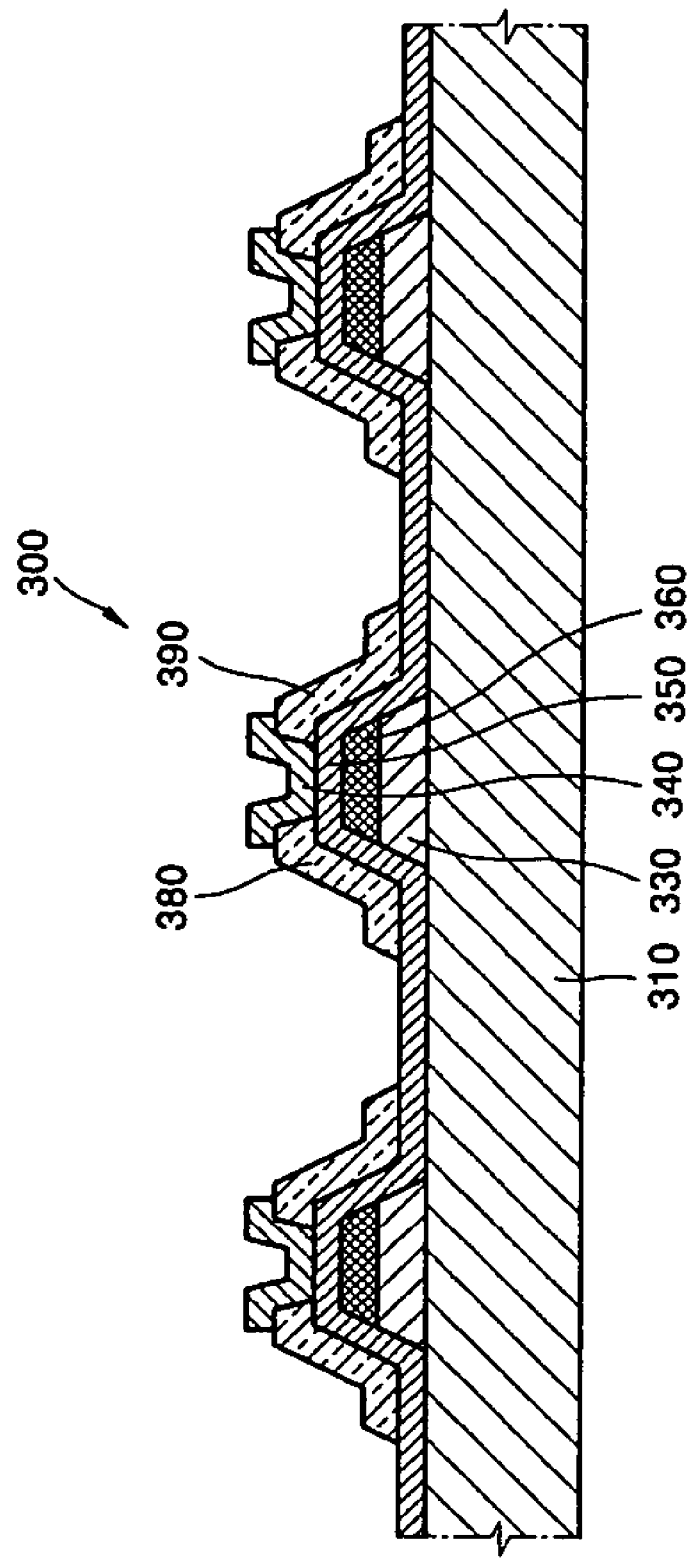
FIG. 8 is a cross-sectional view illustrating a TFT according to an embodiment of the invention.

FIG. 8 is a cross-sectional view illustrating a TFT 300 according to another embodiment of the invention. Referring to FIG. 8, a substrate 310 includes a patterned buffer layer 330 that may be formed of silicon oxide or silicon nitride, a patterned active layer 340 that may directly correspond with the patterned buffer layer 330 on the buffer layer 330, and a gate electrode 360 that may be formed of MoW and is insulated from the active layer 340. In addition, a source electrode 380 and a drain electrode 390, which are respectively insulated from the gate electrode 360 and contact the active layer 340, are included on the substrate 310. A first insulating film 350 may insulate the active layer 340 from the gate electrode 360.

Figure 2:
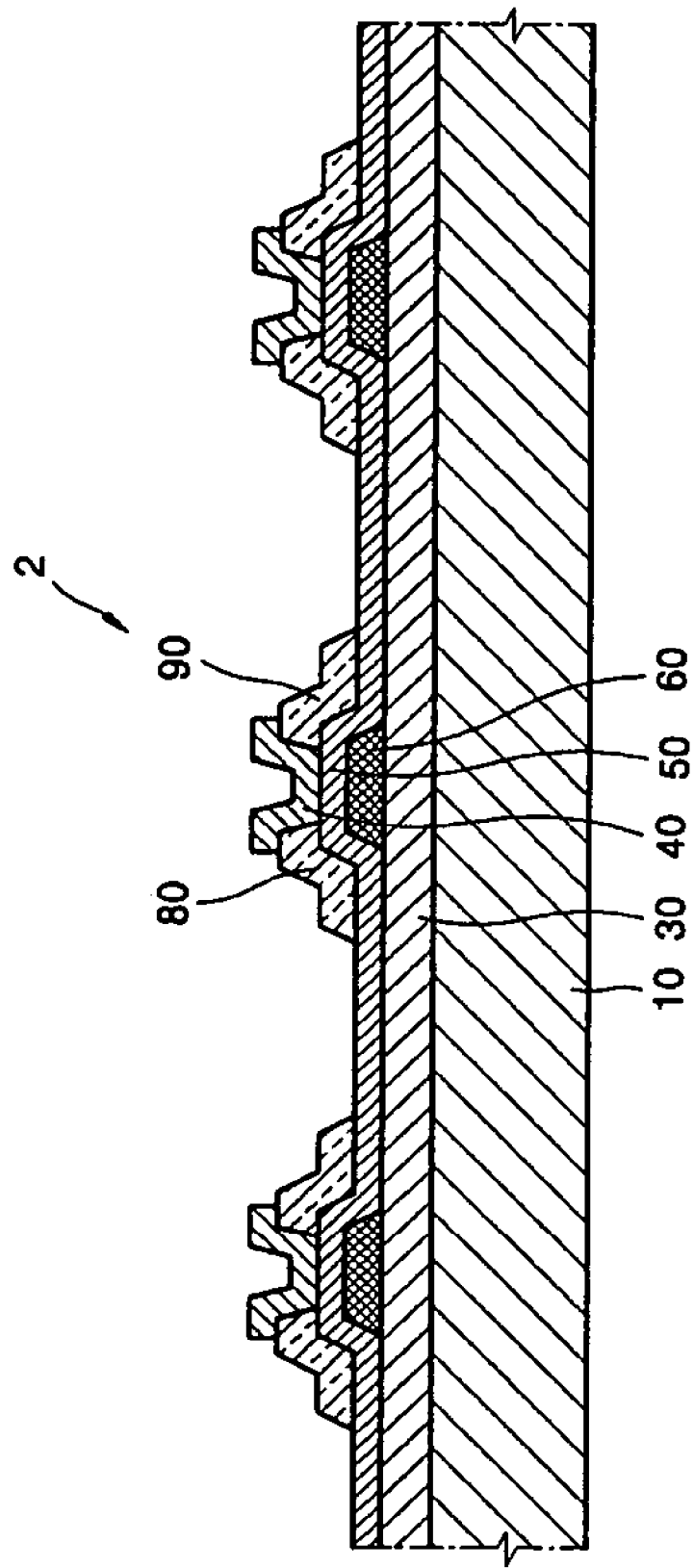
FIG. 2 is a cross-sectional view of another conventional TFT.

At least one difference between the structure described above and shown in FIG. 8 and the conventional structure shown in FIG. 2 is that in the structure described above and shown in FIG. 8, the buffer layer 330 is patterned in substantially the same pattern as the active layer 340.

That is, as shown in FIG. 8, the deformation or the exfoliation of the TFT may be prevented by reducing mechanical stress that is applied to the buffer layer 330 when mechanical stress or torque is applied to the substrate 310 by patterning the buffer layer 330 in substantially the same pattern as the active layer 340.

Particularly, the buffer layer 330 may exfoliate or be at least partially removed from the substrate 310 when mechanical force or torque is applied to the substrate 310 since the adhesion force between the buffer layer 330 and the substrate 310 is not sufficiently strong. However, such exfoliation of the buffer layer 330 from the substrate 310 may be prevented by patterning the buffer layer 330 in substantially the same pattern as the active layer 340.

The active layer 340 may be a polycrystalline silicon layer. When the active layer 340 is a polycrystalline silicon layer, a process for forming the polycrystalline silicon layer from an amorphous silicon layer is needed. The TFT may deform or exfoliate due to heat generated from the process for forming the polycrystalline silicon layer from an amorphous silicon layer or heat generated in a subsequent process. However, the deformation or exfoliation of the buffer layer 330 or the thin substrate 310 due to heat may be prevented by patterning the buffer layer 330 in substantially the same pattern as the active layer 340, as shown in FIG. 8. Also, the buffer layer 330 or the thin substrate 310 may deform or exfoliate due to the difference in thermal expansion coefficient between the buffer layer 330 and the substrate 310 when heat is applied to the TFT in a subsequent process regardless of the flexibility of the substrate 310. However, such deformation or exfoliation of the buffer layer 330 or the thin substrate 310 may also be prevented by forming the buffer layer 330 in substantially the same pattern as the active layer 340 as depicted in FIG. 8.

In the above described embodiments, the TFT has a structure in which the gate electrode is provided over or under the source electrode and the drain electrode; however, the invention is not limited thereto. For example, the TFT may be a coplanar type TFT, an inverted coplanar type TFT, a staggered type TFT, or an inverted staggered type TFT.

Figure 9:
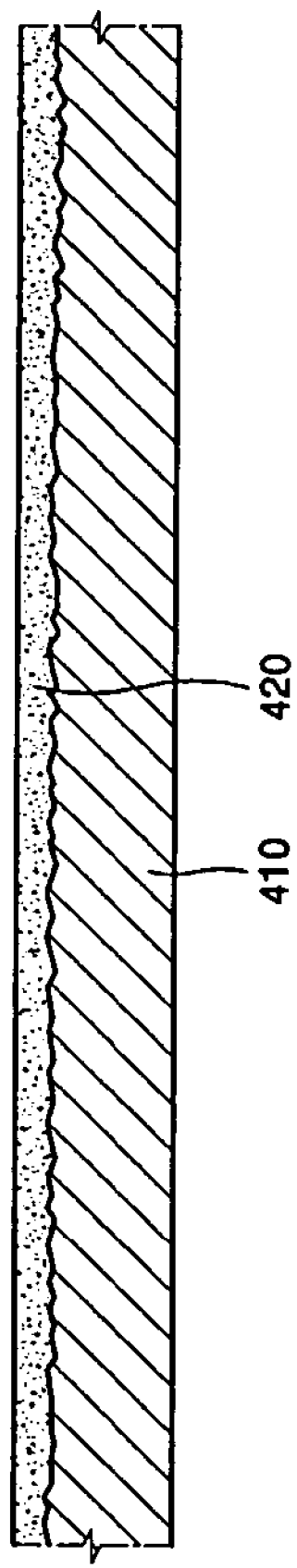
FIGS. 9 and 10 are cross-sectional views illustrating a TFT according to an embodiment of the invention.
Figure 10:
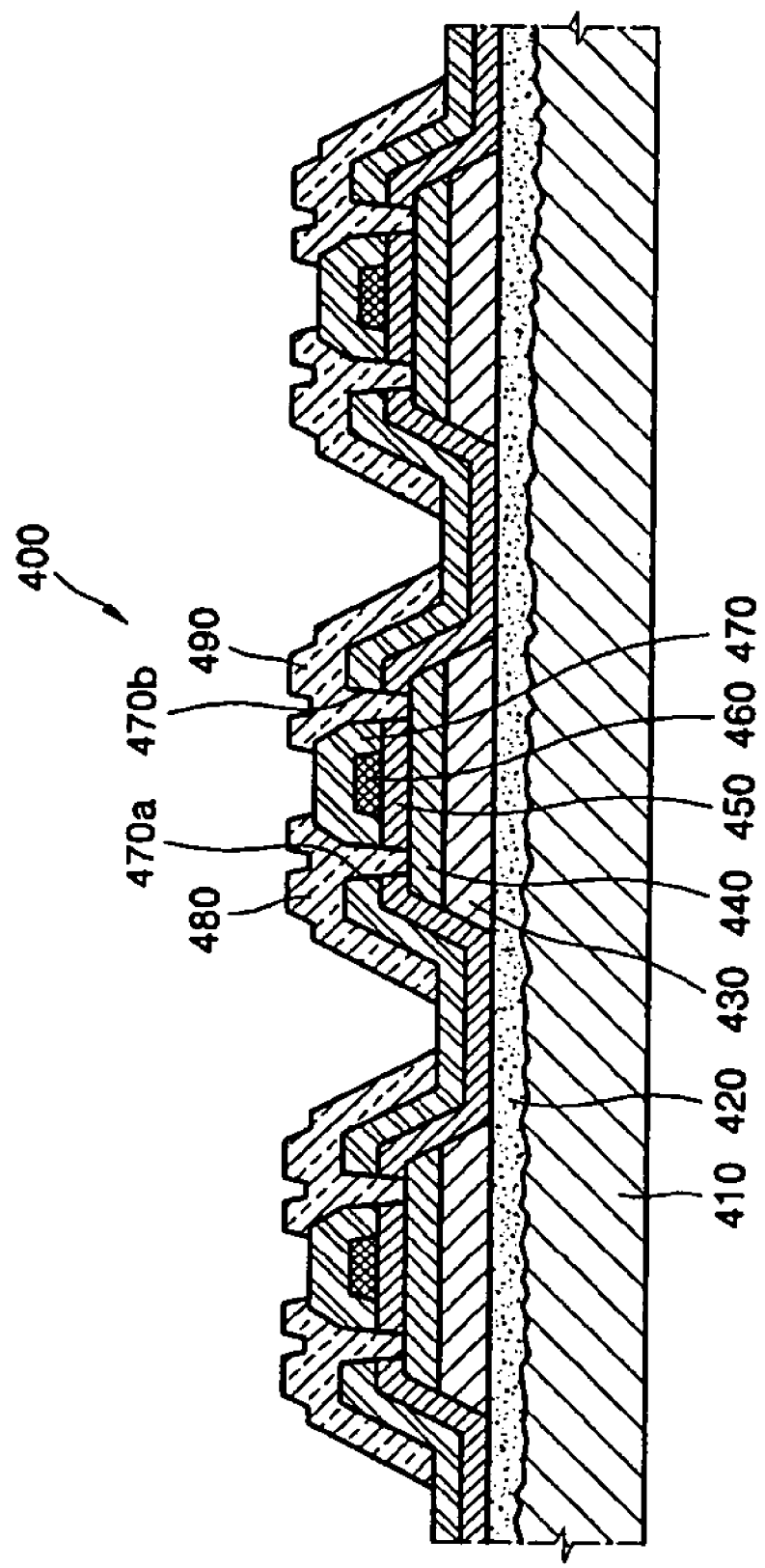

FIG. 9 and FIG. 10 are cross-sectional views illustrating a TFT 400 according to another embodiment of the invention. Referring to FIG. 9, a planarizing film 420 is formed on a substrate 410. In the previously described embodiments, the substrates 110, 210, and 310 may be flexible substrates made of a metal foil or a plastic material.

When the substrate is made of a metal foil, a problem is high surface roughness of the metal foil. The problem may be solved by disposing a planarizing film formed of an organic or inorganic material on the substrate formed of the metal foil prior to forming the TFT.

Referring to FIG. 10, a planarizing film 420 formed of an inorganic material, such as silicon nitride or silicon oxide or an organic material, such as spin on glass (SOG: Si-O network polymers in organic solvents) or Benzocyclobutenes (BCB), and a patterned buffer layer 430 formed of silicon oxide or silicon nitride on the planarizing film 420 are included on a substrate 410. A patterned active layer 440 that directly corresponds with the patterned buffer layer 430 and a gate electrode 460 formed of MoW and insulated from the active layer 440 are provided on the buffer layer 430. In addition, a source electrode 480 and a drain electrode 490 respectively insulated from the gate electrode 460 and contacting the active layer 440 through a first contact hole 470*a* and a second contact hole 470*b* are disposed on the active layer 440. A first insulating film 450 may insulate the active layer 440 from the gate electrode 460, and a second insulating film 470 may insulate the gate electrode 460 from the source electrode 480 and the drain electrode 490. In the above described structure, the buffer layer 430 is patterned in substantially the same pattern as the active layer 440.

That is, as depicted in FIG. 10, a mechanical stress applied to the buffer layer 430 due to a mechanical stress or a torque applied to the substrate 410 may be reduced by patterning the buffer layer 430 in substantially the same pattern as the active layer 440, thereby preventing the deformation or exfoliation of the TFT. Particularly, since the adhesion force between the buffer layer 430 and the planarizing film 420 is not sufficiently strong, when a mechanical stress, such as a twisting of the substrate 410, is applied to the substrate 410, the buffer layer 430 may exfoliate or be partially removed from the planarizing film 420. However, such exfoliation of the buffer layer 430 from the planarizing film 420 may be prevented by patterning the buffer layer 430 in substantially the same pattern as the active layer 440.

Also, as described above, the active layer 440 may be a polycrystalline silicon layer. When the active layer 440 is the polycrystalline silicon layer, a process for forming the polycrystalline silicon layer from an amorphous silicon layer is needed. Further, as shown in FIG. 10, the deformation or exfoliation of the buffer layer 430 or the thin substrate 410 due to heat generated from the process for forming the polycrystalline silicon layer from an amorphous silicon layer or heat generated in a subsequent process may be prevented by patterning the buffer layer 430 in substantially the same pattern as the active layer 440.

Figure 11:
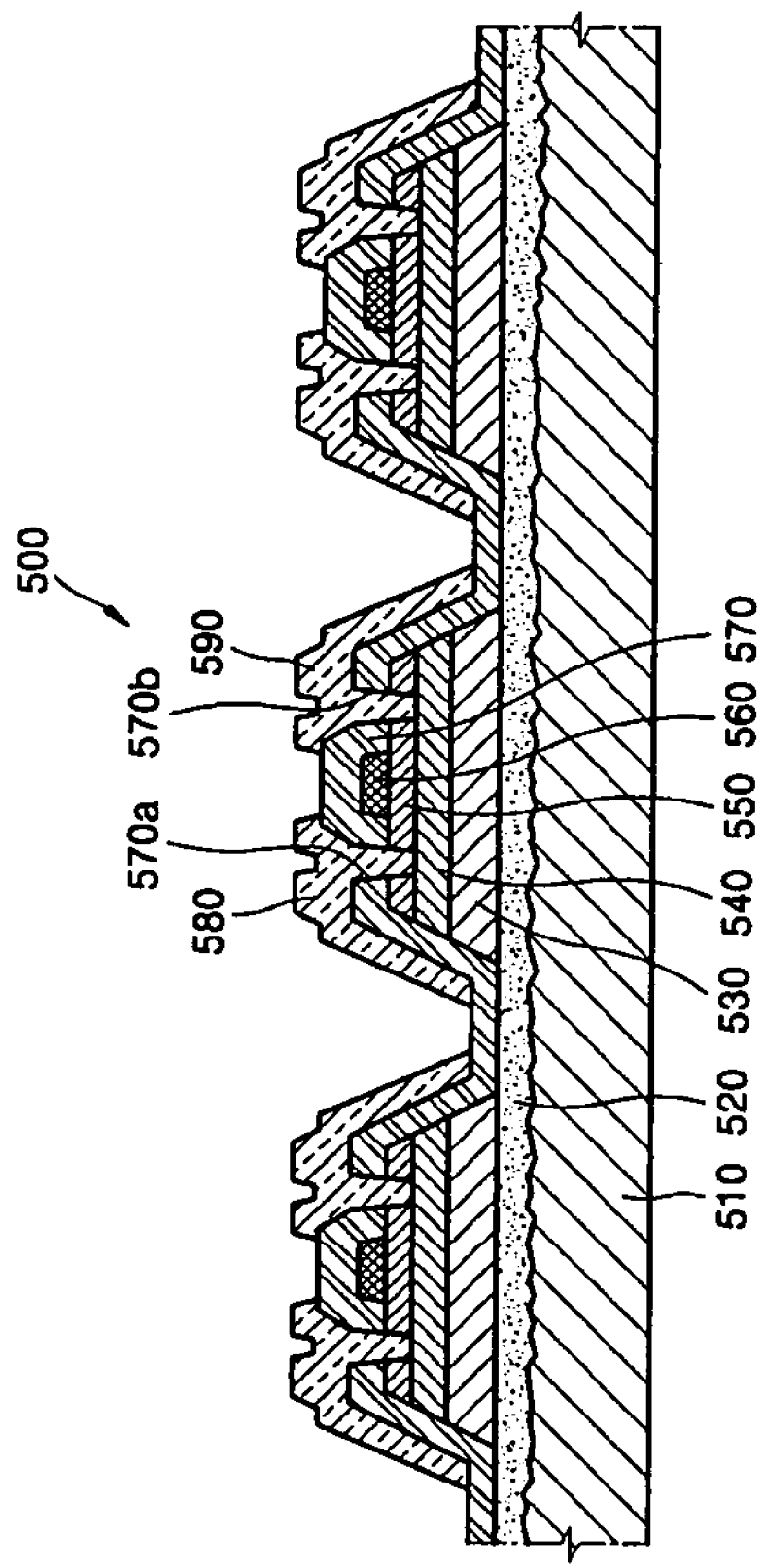
FIG. 11 is a cross-sectional view illustrating a TFT according to an embodiment of the invention.

FIG. 11 is a cross-sectional view illustrating a TFT 500 according to another embodiment of the present invention. Referring to FIG. 11, a substrate 510 includes a patterned buffer layer 530 formed of silicon oxide or silicon nitride, a patterned active layer 540 that directly corresponds with the patterned buffer layer 530 on the buffer layer 530, and a gate electrode 560 formed of MoW and insulated from the active layer 540. A first insulating film 550 that insulates the active layer 540 from the gate electrode 560 is provided between the active layer 540 and the gate electrode 560 and the first insulating film 550 is patterned in direct correspondence with the active layer 540. Further, the substrate 510 includes a source electrode 580 and a drain electrode 590, which are respectively insulated from the gate electrode 560 and contact the active layer 540 through a first contact hole 570*a* and a second contact hole 570*b*. A second insulating film 570 may insulate the gate electrode 560 from the source electrode 580 and the drain electrode 590. In the above structure, the buffer layer 530 and the first insulating film 550 are patterned in substantially the same pattern as the active layer 540.

Particularly, as described above, the buffer layer 530 may exfoliate or be partially removed from the planarizing film 520 when mechanical force or torque is applied to the substrate 510 since the adhesion force between the buffer layer 530 and the planarizing film 520 is not sufficiently strong. However, such exfoliation of the buffer layer 530 from the planarizing film 520 may be prevented by patterning the buffer layer 530 in substantially the same pattern as the active layer 540. Also, as described above, the deformation or exfoliation of the TFT may be prevented when mechanical stress or torque is applied to the substrate 510 by patterning the first insulating film 550 in a pattern corresponding to a pattern of the active layer 540 by which the mechanical stress applied to the buffer layer 530 and the first insulating film 550 may be reduced.

A flexible display may be manufactured when a flat panel display having a display device coupled to a TFT, as described in at least the embodiments discussed above. That is, a stress due to the twisting of the substrate may be decreased by including a patterned buffer layer or a patterned first insulating film in the TFT, thereby improving the reliability and lifetime of the display. A liquid crystal display and an OLED are examples of such a flat panel display.

A flat panel display, such as an LCD or an OLED, uses TFTs as switching devices and driving devices for controlling pixel operations and various drivers. When a TFT of the present invention is used as a driving TFT, the first electrode of the display device may be connected to one of the source electrode and the drain electrode.

The structure of an OLED using TFTs of the present invention is described below as an illustrative example; however, it is understood that the invention is not limited to OLED's.

The OLED includes various pixel patterns according to the color of light emitted from a light emission layer and includes pixels of red, green, and blue colors. Each sub-pixel formed of red, green, and blue colors includes an electroluminescence (EL) device, which is an emissive display device, and at least one TFT connected with the electroluminescence device. In addition, capacitors may also be included in each sub-pixel.

The electroluminescence device is a light emitting device using a current driven operation and a predetermined image is displayed by emitting light of red, green, or blue colors. The electroluminescence device includes a pixel electrode connected with one of a source electrode and a drain electrode of the TFT, a facing electrode covering the entire pixels or corresponding with each pixel, and an intermediate layer that includes at least an electroluminescence layer disposed between the pixel electrode and the facing electrode. The structure of the present invention is not limited thereto.

The pixel electrode functions as an anode and the facing electrode functions as a cathode. It is understood that the polarities of the pixel electrode and the facing electrode may be reversed.

The pixel electrode may be used as a transparent electrode or a reflective electrode. When the pixel electrode is used as a transparent electrode, the pixel electrode may be formed of ITO, IZO, ZnO, or $In_2O_3$, and when the pixel electrode is used as a reflective electrode, the pixel electrode may be formed of ITO, IZO, ZnO, or $In_2O_3$ on a reflective film formed of Ag, Mg, Al, Pt, Pd, Au, Ni, Nd, Ir, Cr, or a compound of these metals.

The facing electrode may also be used as a transparent electrode or a reflective electrode. When the facing electrode is used as a transparent electrode, the facing electrode may include an auxiliary electrode layer or a bus electrode line formed of a material for forming the transparent electrode, such as ITO, IZO, ZnO, or $InO_3$, on an intermediate layer after forming the intermediate layer using a material such as Li, Ca, LiF/Ca, LiF/Al, Al, Ag, Mg, or a compound of these materials. When the facing electrode is used as a reflective electrode, the facing electrode may be formed by depositing a metal, such as Li, Ca, LiF/Ca, LiF/Al, Al, Mg, or a compound of these metals. However, the present invention is not limited thereto and the pixel electrode and the facing electrode may be formed of an organic material, such as a conductive polymer.

Electroluminescence devices are divided into inorganic electroluminescence devices and organic electroluminescence devices according to the material used to form the intermediate layer. When the intermediate layer is formed of an inorganic film, the electroluminescence device is an inorganic electroluminescence device. When the intermediate layer is formed of an organic film, the electroluminescence device is an organic electroluminescence device. In the case of the organic electroluminescence device, the intermediate layer may be formed of a low molecular weight organic film and a polymer organic film.

When the intermediate layer is formed of a low molecular weight film, the intermediate layer may be a Hole Injection Layer (HIL), a Hole Transport Layer (HTL), an Emission Layer (EML), an Electron Transport Layer (ETL), an Electron Injection Layer (EIL) or a combination of these layers, and may be made of copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film may be formed using an evaporation technique. It is understood that the structure of the intermediate layer is not limited to the above description.

When the intermediate layer is formed of a polymer organic film, the intermediate layer may be an HTL and an EML, and the polymer HTL can be formed of poly-(2,4)-ethylene-dihydroxy thiophene (PEDOT) or polyaniline (PANI) using an inkjet printing technique or a spin coating technique. The polymer EML may be formed of Poly-Phenylenevinylene (PPV), Soluble PPV's, Cyano-PPV, or Polyfluorene, and may be formed using a conventional technique, such as an inkjet printing, spin coating, or a thermal transfer technique using a laser. In the case of the polymer organic layer, the structure of the intermediate layer is not limited thereto.

In the case of the inorganic electroluminescence device, the intermediate layer is formed of an inorganic film, and the intermediate layer may include an emission layer and an insulating layer interposed between the emission layer and the electrodes. However, it is understood that the structure of the intermediate layer in the inorganic electroluminescence device is not limited thereto.

The emission layer may be formed of a sulfide, such as ZnS, SrS, or CaS, alkali rare potassium sulfide, such as $CaGa_2S_4$, or $SrGa_2S_4$, or light emission atoms, such as transition metal including Mn, Ce, Tb, Eu, Tm, Er, Pr, and Pb or alkali rare metals.

The electroluminescence display controls an emission of light from each pixel by controlling a current flow to the pixel electrode by connecting at least one TFT, in which a buffer layer or a first insulating film is patterned, with a pixel electrode of the electroluminescence device.

The organic TFT may also be included in an LCD. Therefore, the structure of an LCD panel having an organic TFT is described below.

A plurality of cultivating layers that orient a liquid crystal layer are provided between a first substrate and a second substrate facing each other, and a first electrode is provided between one of the cultivating layers and the first substrate and a second electrode is interposed between the cultivating layer and the second substrate. A color filter layer is interposed between the second substrate and the second electrode.

A first polarizing layer is provided on a surface of the first substrate, the surface being opposite to the second substrate, and a second polarizing layer is provided on a surface of the second substrate, the surface being opposite to the first substrate. A protection film is provided on the second polarizing layer.

In the LCD panel having the above structure, a potential difference between the first electrode and the second electrode is generated by an external signal controlled by the TFT since the first electrode is connected with the TFT in which the buffer layer or the first insulating film is patterned, as described in the embodiments discussed above. The arrangement of the liquid crystal layers is determined by the potential difference generated between the first electrode and the second electrode. The shielding or transmitting of visible light supplied from a back light unit (BLU) included on a lower part of the first substrate of the liquid crystal panel is determined by the arrangement of the liquid crystal layer. A color image is displayed by the transmitted light that takes a predetermined color while passing the color filter layer.

The TFT of the present invention may be used in various flat panel displays besides the electroluminescence display or LCD. Also, the organic TFT may be applied to any equipment that includes a TFT, such as electronic sheets, smart cards, product tags, or plastic chips for RFID (smart tags).

FIGS. 12, 13, 14, 15, and 16 are cross-sectional views illustrating a method of manufacturing the TFT, depicted in FIG. 3, according to the embodiment of the invention discussed above and shown in FIG. 3.

A patterned buffer layer and a patterned active layer provided on at least one region of the patterned buffer layer are formed on a substrate. When the patterned buffer layer directly corresponds with the patterned active layer, the above described operations may include the following operations.

Figure 14:
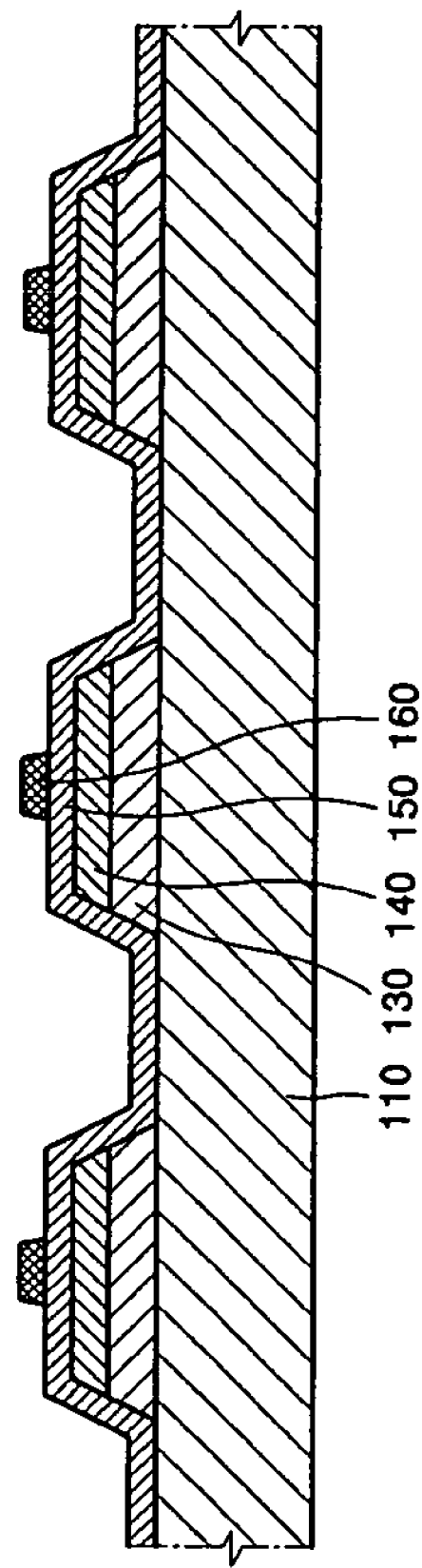
Figure 15:
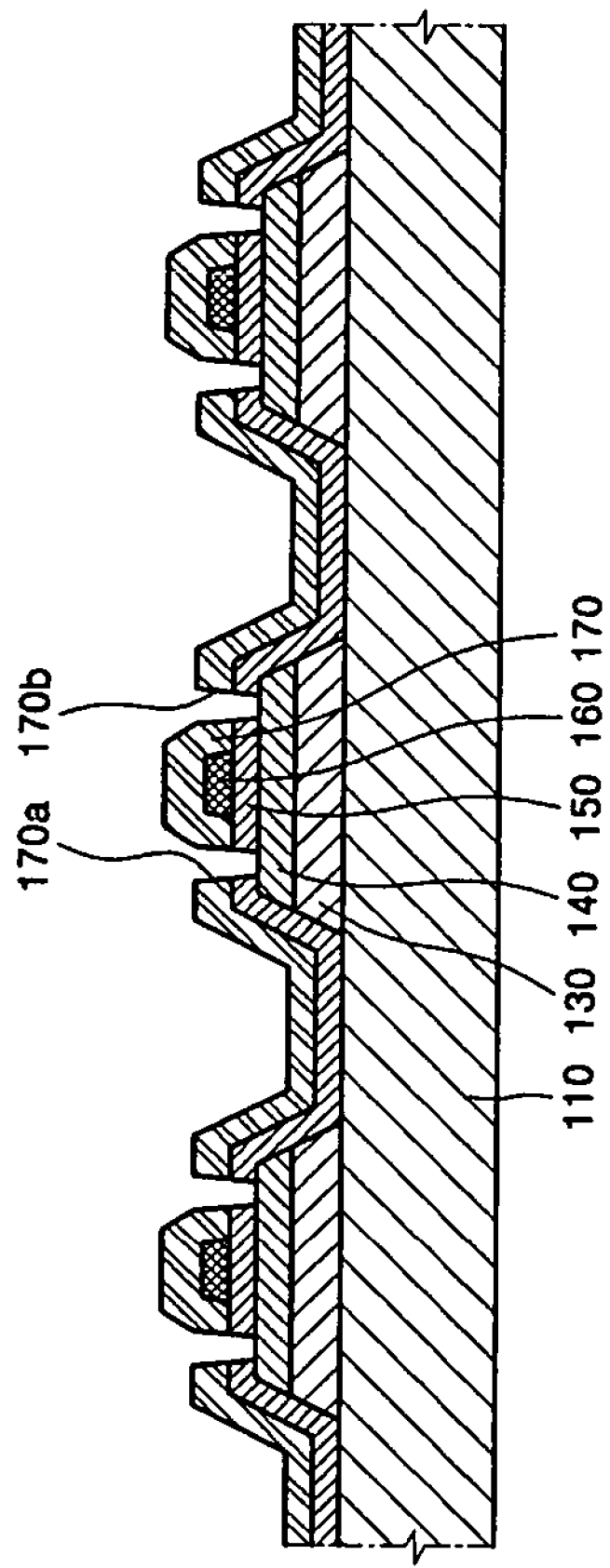

Referring to FIG. 12, for example, a buffer layer 130 and an active layer 140 are sequentially formed on a substrate 110, and the buffer layer 130 and the active layer 140 are patterned having a substantially identical pattern. As shown in FIG. 13, a first insulating film 150 covering the active layer 140 is subsequently formed on an entire surface of the substrate 110, and a first metal layer 162 is formed on the first insulating film 150. As shown in FIG. 14, a gate electrode 160 is subsequently formed by patterning the first metal layer 162. As shown in FIG. 15, a second insulating film 170 covering the gate electrode 160 is subsequently formed on the entire surface of the substrate 110, and a first contact hole 170a and a second contact hole 170b exposing the active layer 140 are formed in the first insulating film 150 and the second insulating film 170. A source electrode 180 and a drain electrode 190 are subsequently respectively connected with the active layer 140 through the first contact hole 170a and the second contact hole 170b, and the source electrode 180 and the drain electrode 190 are formed by patterning the second metal layer. As such a TFT, as shown in FIG. 16 can be obtained.

In the above process, a planarizing layer for planarizing the substrate 110 may be included between the substrate 110 and the buffer layer 130 prior to forming the buffer layer 130 on the substrate 110. The planarizing layer may be made of an inorganic material, such as silicon oxide or silicon nitride, or an organic material, such as Spin On Glass (Si—O network polymers in organic solvents: SOG) or Benzocyclobutenes (BCB).

The active layer 140 on the buffer layer 130 may be an amorphous silicon layer. When a TFT uses a polycrystalline silicon layer as a semiconductor layer, a current driving efficiency may be increased and the size of the TFT formed in each pixel can be reduced since the electron mobility in the polycrystalline silicon TFT is approximately 100 times greater than that of the amorphous silicon. Therefore, the size of the panel may be decreased since the size of a pixel may be reduced, thereby resulting in a higher resolution. Accordingly, the TFT is suitable for manufacturing a display to be used with mobile equipment.

When the polycrystalline silicon layer is used as a semiconductor layer, ON current ratio of an N and P channels of each transistor is balanced and a CMOS circuit may be formed. Therefore, a CMOS circuit may be integrated using the TFT on a circumference of the panel, and the CMOS circuit converts image signals received from an external panel to driving signals for data wirings and gate wirings connected to each pixel. Therefore, the numbers of inputting pins of the panel may be reduced when compared to a TFT that uses amorphous silicon layers as semiconductor layers, which requires inputting pins to each wiring from an external integrated circuit. Such design improves the reliability and impact resistance of a semiconductor formed of a polycrystalline silicon layer.

A polycrystalline silicon layer may be formed by crystallizing an amorphous silicon layer. When the polycrystalline silicon layer is formed by crystallizing the amorphous silicon layer, the crystallizing the amorphous silicon layer may be included between patterning the buffer layer 130 in the same pattern as the active layer 140 and forming the first insulating film 150 covering the active layer 140 on the entire surface of the substrate 110.

The amorphous silicon layer is crystallized at a relatively high temperature through a process such as solid phase crystallization (SPC) or eximer laser crystallization (ELC). Therefore, in this process, the buffer layer 130 or the thin substrate 110 may deform or exfoliate due to a difference in a thermal expansion coefficient between the buffer layer 130 and the substrate 110. However, as described above, the deformation or exfoliation of the buffer layer 130 or the substrate 110 may be prevented by patterning the buffer layer 130 in substantially the same pattern as the active layer 140 prior to crystallizing the amorphous silicon layer.

To manufacture a TFT according to the embodiment shown in FIG. 5 in the manufacturing processes described above, patterning the first insulating film 250 may be performed between the forming of the first insulating film 250 covering the active layer 240 on the entire surface of the substrate 210 and the forming of the first metal layer 262 on the first insulating film 250. The first metal layer 262 may subsequently be formed to cover the first insulating film 250 on the entire surface of the substrate 210. The patterning of the first insulating film 250 may directly correspond with patterning of the patterned active layer 140.

A TFT, a flat panel display having the TFT, and a method of manufacturing the TFT according to the present invention provide at least the following advantages.

A mechanical stress applied to a buffer layer when a mechanical stress or a torque is applied to a substrate may be reduced by patterning the buffer layer, thereby preventing the deformation or exfoliation of the TFT.

The deformation or exfoliation of the buffer layer from the substrate when mechanical stress or torque is applied to the substrate and an adhesion force between the buffer layer and the substrate may be prevented by patterning the buffer layer.

The deformation or exfoliation of the buffer layer from the substrate due to a difference in a thermal expansion coefficient of the buffer layer and that of the substrate when the TFT is processed at a high temperature in a subsequent process may be prevented by patterning the buffer layer.

A mechanical stress applied to an insulating film when a mechanical stress is applied to the substrate in a subsequent process may be reduced by patterning an insulating film disposed on the silicon layer, thereby preventing the deformation or exfoliation of the TFT.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
   a substrate;
   a patterned buffer layer provided on the substrate, the patterned buffer layer being formed of an insulating material;
   a patterned active layer provided on the patterned buffer layer;
   a gate electrode provided on and insulated from the patterned active layer by a patterned first insulating film, the patterned first insulating film being patterned in the same pattern as the patterned active layer such that outer ends of the patterned first insulating film coincide with outer ends of the patterned active layer; and
   a source electrode and a drain electrode that contact the patterned active layer and are insulated from the gate electrode,
   wherein the patterned active layer is patterned in substantially the same pattern as the patterned buffer layer and is interposed between the patterned buffer layer and the gate electrode,
   wherein sidewalls of the patterned buffer layer, the patterned active layer, and the patterned first insulating film are sloped, and
   wherein the outer ends of the patterned active layer coincide with outer ends of the patterned buffer layer.

2. The thin film transistor of claim 1, further comprising:
   an insulating film that insulates the gate electrode from the source electrode and the drain electrode.

3. The thin film transistor of claim 1, further comprising:
   a planarizing film provided between the substrate and the buffer layer.

4. The thin film transistor of claim 3, wherein the planarizing film is formed of an inorganic material or an organic material.

5. The thin film transistor of claim 1, wherein the active layer is a polycrystalline silicon layer.

6. The thin film transistor of claim 1, wherein the substrate is flexible.

7. A flat panel display comprising a display device coupled with the thin film transistor of claim 1.

8. A thin film transistor, comprising:
   a substrate;
   a patterned buffer layer provided on the substrate, the patterned buffer layer being formed of an insulating material;
   a patterned active layer provided on the patterned buffer layer;
   a gate electrode provided on and insulated from the patterned active layer;
   a source electrode and a drain electrode that contact the patterned active layer and are insulated from the gate electrode; and
   a patterned first insulating film that insulates the patterned active layer from the gate electrode,
   wherein the patterned first insulating film is patterned in the same pattern as the patterned active layer such that outer ends of the patterned first insulating film coincide with outer ends of the patterned active layer and is interposed between the patterned active layer and the gate electrode,
   wherein sidewalls of the patterned buffer layer, the patterned active layer, and the patterned first insulating film are sloped,
   wherein the patterned first insulating film is patterned in substantially the same pattern as the patterned buffer layer, and
   wherein the outer ends of the patterned first insulating film coincide with outer ends of the patterned buffer layer.

* * * * *